United States Patent
Hosono et al.

(10) Patent No.: US 6,255,596 B1
(45) Date of Patent: *Jul. 3, 2001

(54) ALUMINUM STABILIZED SUPERCONDUCTOR WITH CU AND MG

(75) Inventors: Fumikazu Hosono; Noriyuki Tatsumi; Kenichi Kikuchi; Genzo Iwaki; Hidezumi Moriai; Hitoshi Yasuda; Akihiko Takahashi, all of Ibaraki (JP)

(73) Assignees: Hitachi Cable Ltd., Tokyo; Sumitomo Chemical Company, Limited, Osaka, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/064,836

(22) Filed: Apr. 23, 1998

(30) Foreign Application Priority Data

Apr. 25, 1997 (JP) .................................... 9-109732
Sep. 11, 1997 (JP) .................................... 9-247343

(51) Int. Cl.$^7$ .................................................. H01B 12/00
(52) U.S. Cl. .................... 174/125.1; 505/231; 505/704; 505/887
(58) Field of Search .................. 505/230, 231, 505/704, 884, 887; 174/125.1

(56) References Cited

U.S. PATENT DOCUMENTS

| | | | |
|---|---|---|---|
| 3,702,373 | * 11/1972 | Ecomard et al. | 174/125.1 |
| 3,714,371 | 1/1973 | Nomura et al. | 174/125.1 |
| 4,757,161 | 7/1988 | Wilhelm et al. | 174/125.1 |
| 4,917,965 | * 4/1990 | Iuoue et al. | |
| 4,927,985 | * 5/1990 | Iyer et al. | 174/125.1 |
| 4,959,279 | 9/1990 | Tanaka et al. | 428/660 |
| 5,266,416 | 11/1993 | Inoure et al. | 428/661 |

FOREIGN PATENT DOCUMENTS 5-74235   3/1993   (JP) .

OTHER PUBLICATIONS

Matweb material information sheet, alloys of aluminum and magnesium, www.matweb.com\GetCompMatis.asp.*
Matweb material information sheet, aluminum 1199–O, www.matweb.com\specificmaterials.asp?bassnum=MA1190&group=.*
"D1–12" The 50$^{th}$ Autumn 1993 Low Temperature Engineering—Superconductor Society meeting, p. 86. (see English translation).
S. Suzuki, et al, "Development of Aluminum Stabilized NbTi/Cu Superconductor," The Hitachi Densen, Dec. 1982, No. 2, pp. 57–62.

* cited by examiner

Primary Examiner—Jeffrey Gaffin
Assistant Examiner—Kamand Cuneo
(74) Attorney, Agent, or Firm—McDermott, Will & Emery

(57) ABSTRACT

A tube made of oxygen free copper is filled with a plurality of copper matrix Nb—Ti superconducting lead wires to obtain a composite billet. The resulting billet is subjected to hydrostatic pressure extrusion. Further, ageing heat treatment and wire drawing process are repeated for the composite material three times to prepare a Cu/Nb—Ti superconducting single wire. Then, the resulting Cu/Nb—Ti superconducting single wires are stranded each other to produce a superconducting strand. The superconducting strand is coated with an aluminum alloy to which either a content of 20 to 100 ppm of Cu and Mg or Mg, or a content of 10 to 120 ppm of Si and Cu is added by means of hot extrusion, the strand thus extruded is reduced by 0 to 20% in accordance with cold working to produce an aluminum stabilized superconductor. As a result, such aluminum stabilized superconductor having high mechanical strength as well as good thermal and electrical stability is provided while achieving light weight and downsizing thereof.

2 Claims, 5 Drawing Sheets

SAMPLE CONTOUR

TEST METHOD

ALUMINUM STABILIZED SUPERCONDUCTOR WITH CU AND MG

FIELD OF THE INVENTION

The present invention relates to a superconductor, and particularly to an aluminum stabilized superconductor which is excellent in mechanical strength as well as in thermal and electrical stability, and which is used suitably for superconducting magnet.

BACKGROUND OF THE INVENTION

Heretofore, a superconducting lead wire prepared by embedding a superconducting filament such as a Nb—Ti alloy bar into copper matrix has been employed as a conductor for superconducting magnet.

Such superconducting lead wire as described above is manufactured in accordance with, for example, the following manner. First, a Nb—Ti alloy bar is inserted into a copper tube to produce a composite billet, a Cu/Nb—Ti composite bar is produced in accordance with hydrostatic pressure extrusion, and then diameter of the resulting composite bar is reduced by wire drawing process. Furthermore, a plurality of Cu/Nb—Ti composite bars are made up into a bundle, and a copper or a copper alloy tube is again filled with the resulting bundle to prepare a composite billet, and thereafter a superconducting single wire is produced in accordance with the above-mentioned process. Then, a required number of the superconducting single wires are stranded with each other thereby to manufacture a superconducting lead wire.

A superconductor is prepared by including a pure aluminum which is covered with a Cu—2Ni alloy which is used as a cladding material disposed under a superconducting strand composed of a plurality of the Cu/Nb—Ti superconducting single wires, and coating these materials with copper used for stabilization. The superconductor thus constituted exhibits excellent mechanical strength.

Moreover, another conventional aluminum stabilized superconductor has been disclosed in Japanese Patent Application Laid-Open No. 5-74235. This aluminum stabilized superconductor has such structure wherein a superconducting strand composed of a plurality of Cu/Nb—Ti superconducting single wires is covered with an aluminum alloy for stabilization which is prepared by adding a predetermined amount of Cu and Si to pure aluminum, respectively, for increasing mechanical strength of the superconductor.

However, according to the former conventional superconductor, it is difficult to achieve light weight and downsizing thereof, because the stabilizing material (stabilizer) is made from copper and there is use of a cladding material.

On the other hand, according to the latter conventional superconductor, although light weight and downsizing thereof can be achieved, it is insufficient in mechanical strength as well as in thermal and electrical stability, because an adding amount of Cu and Si is not suitable, respectively.

SUMMARY OF THE INVENTION

Accordingly, an object of the present invention is to provide an aluminum stabilized superconductor having high mechanical strength as well as exhibiting good thermal and electrical stability while achieving light weight and downsizing thereof.

According to the first aspect of the invention, an aluminum stabilized superconductor, comprising:

a superconducting wire material prepared by embedding superconducting filaments in copper or a copper alloy matrix; and an aluminum-stabilizing material covering the circumference of said superconducting wire material;

the 0.2% proof stress of the aluminum-stabilizing material is 4 kgf/mm$^2$ or more at room temperature and 250 or more of residual resistance ratio wherein said 0.2% proof stress is a stress, such as that applied in a tension test, that causes a small permanent deformation of 0.2% in the material; and the aluminum-stabilizing material being an aluminum alloy containing 10 to 100 ppm of Mg, and the remainder of Al and unavoidable impurities.

According to the second aspect of the invention, An aluminum stabilized superconductor, comprising:

a superconducting wire material prepared by embedding superconducting filaments in copper or a copper alloy matrix; and an aluminum-stabilizing material covering the circumference of said superconducting wire material;

the 0.2% proof stress of the aluminum-stabilizing material is 4 kgf/mm$^2$ or more at room temperature and 250 or more of residual resistance ratio wherein said 0.2% proof stress is a stress, such as that applied in a tension test, that causes a small permanent deformation of 0.2% in the material; and the aluminum-stabilizing material being an aluminum alloy containing 0 to 120 ppm of the sum of contents of Si and Cu, and the remainder of Al and unavoidable impurities.

According to the third aspect of the invention, An aluminum stabilized superconductor, comprising:

a superconducting wire material prepared by embedding superconducting filaments in copper or a copper alloy matrix; and an aluminum-stabilizing material covering the circumference of said superconducting wire material;

the aluminum-stabilizing material having 4 kgf/MM$^2$ or more in 0.2% proof stress at room temperature and 250 or more of residual resistance ratio; and the aluminum-stabilizing material being an aluminum alloy containing 20 to 100 ppm of the sum of contents of Mg and Cu, and the remainder of Al and unavoidable impurities.

BRIEF DESCRIPTION OF THE DRAWINGS

The invention will be explained in more detail in conjunction with the appended drawings, wherein.

DESCRIPTION OF THE PREFERRED EMBODIMENTS

Before explaining an aluminum stabilized superconductor in a preferred embodiment according to the invention, the aforementioned conventional aluminum stabilized superconductor will be explained in FIGS. 1 and 2.

Figure 1:
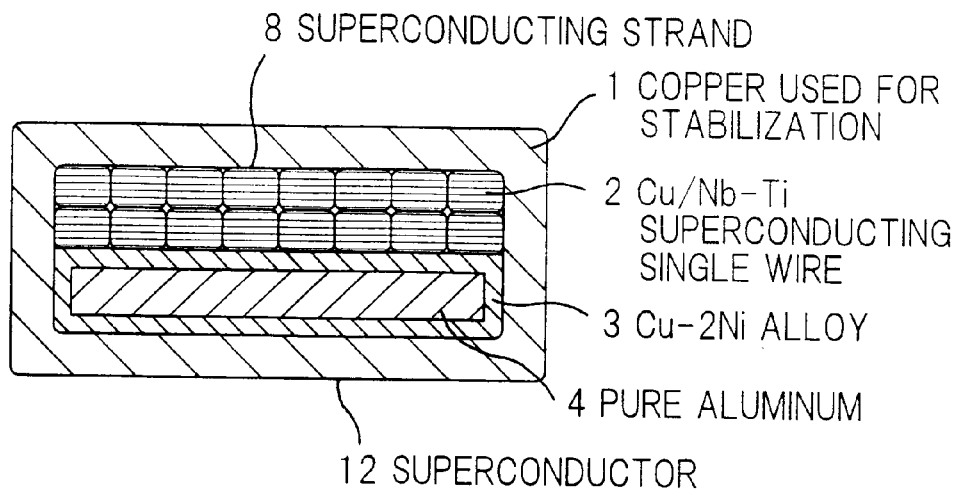
FIG. 1 is a sectional view showing a conventional aluminum stabilized superconductor.

FIG. 1 shows the above-mentioned conventional superconducting lead wire. A superconductor 12 is prepared in accordance with such a manner that pure aluminum 4 around which a Cu—2Ni alloy 3 is used as a cladding material is disposed under a superconducting strand 8 composed of a plurality of Cu/Nb—Ti superconducting single wires 2, and these components are coated with stabilizing copper 1. The resulting superconductor having such structure as described above exhibits excellent mechanical strength.

Figure 2:
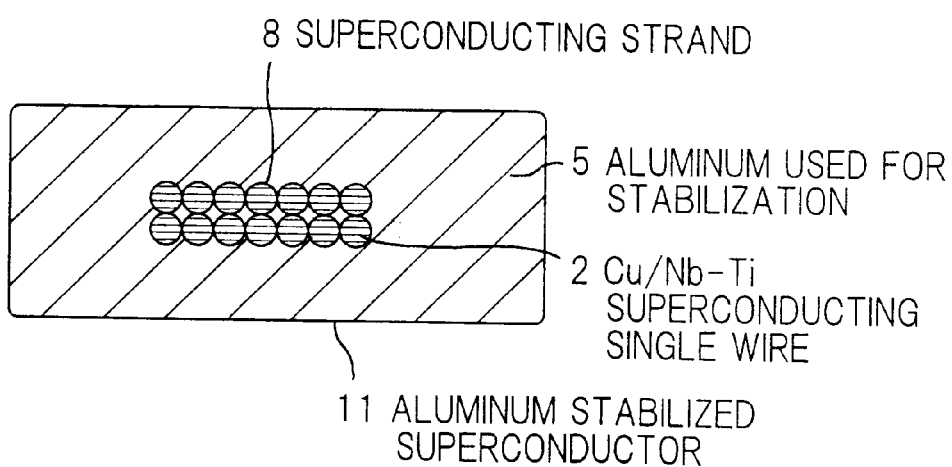
FIG. 2 is a sectional view showing another conventional aluminum stabilized superconductor.

FIG. 2 shows the other above-mentioned conventional aluminum stabilized superconductor. An aluminum stabilized superconductor 11 has a structure in which a superconducting strand 8 consisting of a plurality of Cu/Nb—Ti superconducting single wires 2 is covered with an aluminum alloy 5 used for stabilization wherein the aluminum alloy 5 for stabilization is prepared by adding a prescribed amount of Cu and Si to pure aluminum, respectively, in order to increase mechanical strength of the superconductor.

Next, an aluminum stabilized superconductor in the first preferred embodiment according to the invention will be explained in FIG. 3.

Figure 3:
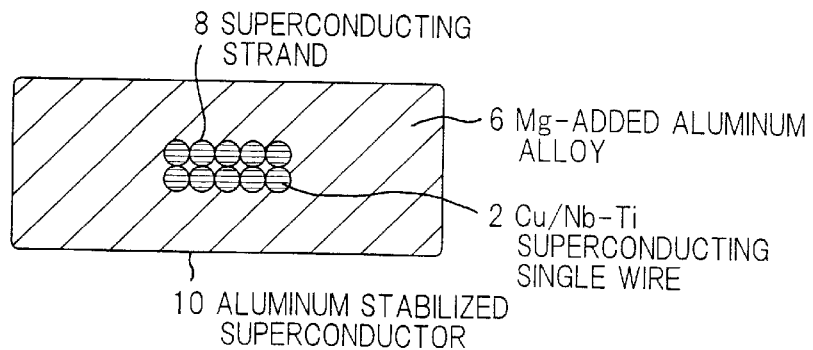
FIG. 3 is a sectional view showing an aluminum stabilized superconductor according to a first preferred embodiment of the present invention.

FIG. 3 shows the aluminum stabilized superconductor and which is prepared in accordance with the following manner.

A tube made of oxygen free copper is filled with about 700 of copper matrix Nb—Ti superconducting lead wires to obtain a composite billet, the resulting billet is subjected to hydrostatic pressure extrusion, and further, ageing heat treatment and wire drawing process are repeated for the composite material three times to prepare a Cu/Nb—Ti superconducting single wire 2 having 0.74 mm diameter. Then, ten of the resulting Cu/Nb—Ti superconducting single wires 2 are stranded each other to produce a flat type superconducting strand 8 having 1.33 mm thickness and 3.7 mm width.

The superconducting strand 8 is coated with a Mg-added aluminum alloy 6 by means of hot extrusion, the strand 8 thus extruded is reduced by 0 to 20% in accordance with cold working to produce an aluminum stabilized superconductor 10 having 10 mm thickness and 20 mm width according to the present invention. In the present preferred embodiment, the Mg-added aluminum alloy 6 is obtained by adding 10 to 100 ppm of Mg to aluminum having 99.999% purity.

In the following, the optimum condition with respect to a relationship between a reduction ratio of cold working after coating a superconductor with aluminum and a concentration of Mg to be added to pure aluminum will be described.

Figure 4A:
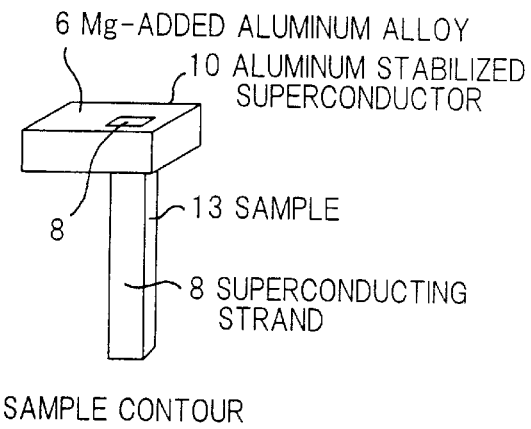
FIGS. 4A and 4B are diagrammatic representations each illustrating a device for measuring an interfacial shearing stress between a superconducting strand and stabilized aluminum with respect to a reduction ratio of cold working of an aluminum stabilized superconductor.
Figure 4B:
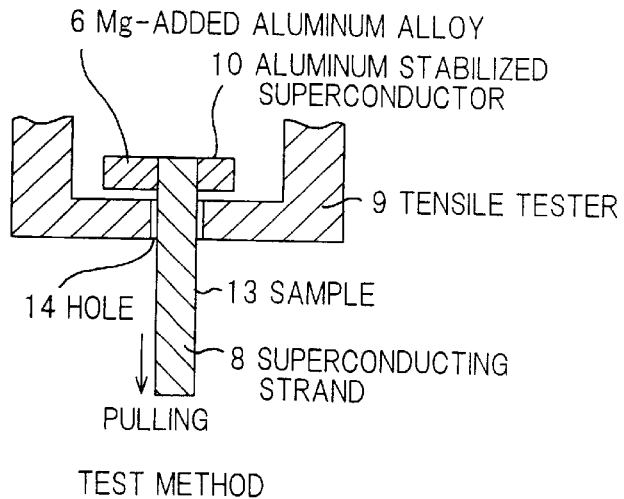

FIGS. 4A and 4B show diagrammatic representations each illustrating a device for measuring interfacial adhesion (interfacial shearing stress ($kg/mm^2$)) defined between superconducting strand and aluminum used for stabilization with respect to reduction ratio of cold working in an aluminum stabilized superconductor wherein FIG. 4A shows a contour of a sample 13 for the aluminum stabilized superconductor 10 from which interfacial shearing stress is to be measured. In the sample 13, the superconducting strand 8 is exposed as a result of removing the Mg-added aluminum alloy 6 from the aluminum stabilized superconductor 10 while leaving a portion used for measuring interfacial shearing stress. FIG. 4B shows that the sample 13 is set in a tensile tester 9, and then tensile test is conducted for the sample. As shown in FIG. 4B, the exposed superconducting strand 8 is passed through a hole 14 defined on the tensile tester 9, and a portion to which the Mg-added aluminum alloy 6 adheres is contained in the tensile tester 9. In this situation, the superconducting strand 8 projected from the tensile tester 9 through the hole 14 is pulled in the direction towards the lower part of FIG. 4B, whereby an interfacial shearing stress ($kg/mm^2$) defined between the superconducting strand 8 in each reduction ratio of cold working and the Mg-added aluminum alloy 6 is measured.

The following Table 1 shows measured results of interfacial shearing stress ($kg/mm^2$) defined between superconducting strand and aluminum used for stabilization by the use of the device shown in FIGS. 4A and 4B with respect to each reduction ratio of cold working of an aluminum stabilized superconductor which is prepared by coating a superconducting strand with pure aluminum having 99.999% purity without adding any Mg. In this measurement, reduction ratio of cold working varies over a range of 0, 5, 10, 15, 20, 25, 30, 35, 40, and 45%. The measurement is conducted at room temperature, and interfacial shearing stress corresponds to a value obtained by dividing tensile force by an area of the interface.

TABLE 1

| Reduction ratio of Cold Working (%) | Interfacial Shearing Stress ($kg/mm^2$) |
| --- | --- |
| 0 | 2.5 |
| 5 | 2.4 |
| 10 | 2.4 |
| 15 | 2.1 |
| 20 | 2.1 |
| 25 | 1.6 |
| 30 | 1.5 |
| 35 | 1.2 |
| 40 | 0.5 |
| 45 | 0.3 |

From results shown in Table 1, it is understood that although interfacial shearing stress does not scarcely deteriorate in the case where a reduction ratio of cold working is equal to or less than 20%, it deteriorates rapidly when exceeded 20%. Such interfacial shearing stress (adhesion of interface) has a connection with thermal stability. In the case when interfacial shearing stress is low, it means that joining the superconducting strand 8 to the Mg-added aluminum alloy 6 is insufficient so that heat produced in accordance with mechanical disturbance cannot be conducted instantly to the Mg-added aluminum alloy 6, and thus, a period of time during which the heat is kept inside the superconducting strand 8 is prolonged. As a result, there is a case where the superconducting strand 8 cannot be returned to superconducting state, but it reaches to quenching state. Under certain circumstances, there is further a case where no heat is conducted to the Mg-added aluminum, alloy 6.

In these circumstances, effective heat flux ($W/cm^2$) being heat quantity per unit time (W) transferring per unit area (1 $cm^2$) was measured with respect to a sample belonging to the same lot as the sample for which the above described interfacial shearing stress was measured.

Figure 5:
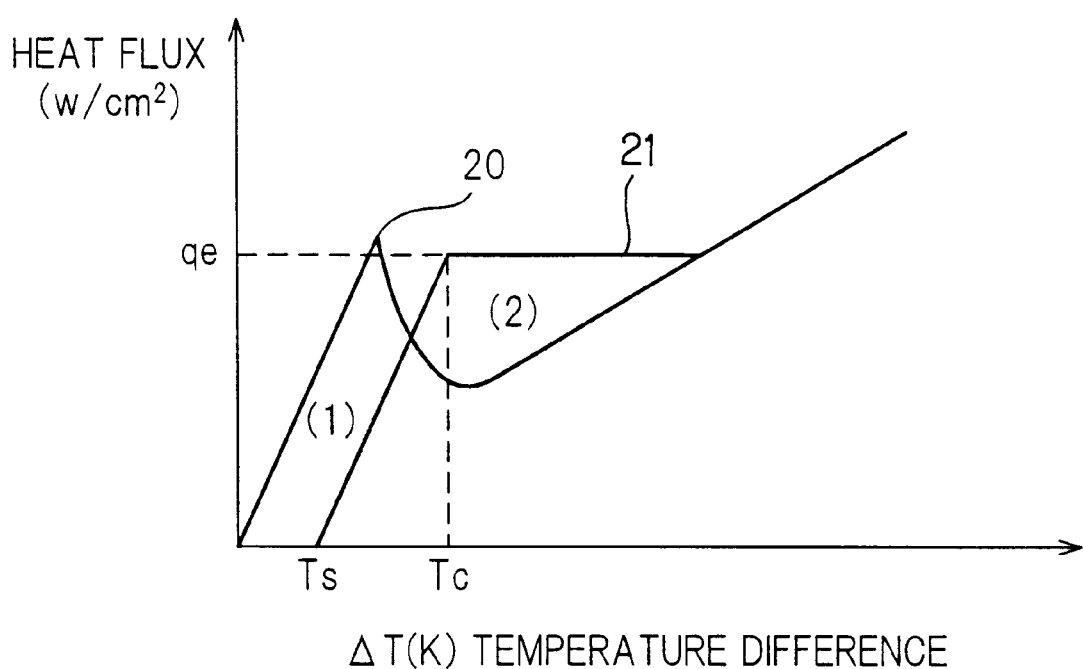
FIG. 5 is a graphical representation showing a relationship between heat flux and temperature difference between conductor and refrigerant medium.

FIG. 5 is a graphical representation showing a relationship between heat flux and temperature difference wherein the heat flux (W/cm$^2$) is plotted as abscissa and the temperature difference $\Delta T$ (K) as ordinate in which the graph is represented by a cooling curve 20 and an exotherm curve 21. The effective heat flux in this case corresponds to a value in the case where an area (1) becomes equal to an area (2), both the areas being indicated by the cooling curve 20 and the exotherm curve 21, respectively, and this value corresponds to a value qe shown in FIG. 5. In FIG. 5, Tc indicates a value obtained by subtracting a temperature of a refrigeration medium from a critical temperature of a conductor, while Ts indicates a value obtained by subtracting a temperature of the refrigeration medium from a current shearing temperature of a conductor. Further, it is to be noted that the magnetic field in this case was 5T.

The following Table 2 indicates a relationship between reduction ratio of cold working and effective heat flux. From also the results of effective heat flux indicating thermal stability of the aluminum stabilized superconductor 10 shown in Table 2, it is understood that deterioration of thermal stability becomes remarkable, when a reduction ratio of cold working exceeds 20%.

TABLE 2

| Reduction ratio of Cold Working (%) | Effective Heat Flux (W/cm$^2$) |
|---|---|
| 0 | 0.298 |
| 5 | 0.292 |
| 10 | 0.293 |
| 15 | 0.286 |
| 20 | 0.287 |
| 25 | 0.222 |
| 30 | 0.220 |
| 35 | 0.203 |
| 40 | 0.190 |
| 45 | 0.152 |

As is understood from the results shown in Tables 1 and 2, 20% or less of cold working is desirable for the superconductor 8 after being coated with the Mg-added aluminum alloy 6 in accordance with hot extrusion in view of both mechanical strength and thermal stability.

On the other hand, a high residual resistance ratio RRR of the Mg-added aluminumalloy 6 is desirable. For sufficient thermal and electrical stability, it is required that RRR is 250 or more wherein RRR is a ratio of a resistance value $\rho$ (RT) at room temperature to a resistance value $\rho$ (4.2K) at very low temperature 4.2K, and it is represented by an equation RRR=$\rho$ (RT)/$\rho$ (4.2K). In the following Table 3, values of RRR in accordance with a relationship between Mg content of Mg-added aluminum alloy and reduction ratio of cold working of superconductor are shown. In this case, degrees of cold working are 0, 5, 10, 15, 20, 25, and 30%, respectively.

TABLE 3

| Amount of Mg Added (ppm) | Reduction ratio of Cold Working (%) | | | | | | |
|---|---|---|---|---|---|---|---|
| | 0 | 5 | 10 | 15 | 20 | 25 | 30 |
| 0 | 8100 | 3023 | 2015 | 1050 | 804 | 504 | 300 |
| 20 | 4092 | 1527 | 1017 | 520 | 460 | 422 | 285 |
| 50 | 833 | 628 | 500 | 450 | 420 | 401 | 202 |
| 80 | 611 | 552 | 478 | 423 | 400 | 350 | 198 |
| 100 | 400 | 329 | 290 | 260 | 250 | 156 | 110 |

Moreover, when the aluminum stabilized superconductor 10 is used as a conductor for large-sized magnet, 4 kg/mm$^2$ or higher value is required in 0.2% proof stress to avoid deformation due to electromagnet force. In the following Table 4, values of 0.2% proof stress in accordance with a relationship between Mg content of Mg-added aluminum alloy and reduction ratio of cold working of superconductor are shown. In this case, degrees of cold working are 0, 5, 10, 15, 20, 25, and 30%, respectively.

TABLE 4

| Amount of Mg Added (ppm) | Reduction ratio of Cold Working (%) | | | | | | |
|---|---|---|---|---|---|---|---|
| | 0 | 5 | 10 | 15 | 20 | 25 | 30 |
| 0 | 0.87 | 2.9 | 3.9 | 4.5 | 5.6 | 7.1 | 8.0 |
| 20 | 0.90 | 4.1 | 6.1 | 9.2 | 12.3 | 15.0 | 18.0 |
| 50 | 0.94 | 4.6 | 6.9 | 9.9 | 12.9 | 15.8 | 18.8 |
| 80 | 1.0 | 6.0 | 10.9 | 15.8 | 21.2 | 26.3 | 31.5 |
| 100 | 1.2 | 9.2 | 17.2 | 25.2 | 38.4 | 41.2 | 49.2 |

In Tables 3 and 4, 0.2% proof stress elevates with increase in Mg content, on the contrary, RRR decreases. It is understood that a range of Mg content for satisfying both the RRR and the 0.2% proof stress is 20 to 100 ppm.

Next, a case wherein Si and Cu are added to aluminum in place of Mg will be described.

In the following Table 5, values of RRR as well as those of 0.2% proof stress in accordance with a relationship between Si and Cu contents contained in aluminum used for stabilization and reduction ratio of cold working of superconductor are shown. In this case, reduction ratio of cold working is 5%, and the Si and Cu contents range from 0 to 60 ppm, respectively.

TABLE 5

| Amount of Si Added (ppm) | Amount of Cu Added (ppm) | RRR | 0.2% Proof Stress (kg/mm$^2$) R.T |
|---|---|---|---|
| 0 | 0 | 3023 | 2.9 |
| 10 | 0 | 2014 | 3.2 |
| | 10 | 1651 | 4.05 |
| | 20 | 1475 | 4.1 |
| | 30 | 1351 | 4.2 |
| | 60 | 869 | 5.0 |
| | 120 | 375 | 6.0 |
| | 130 | 240 | 6.5 |
| 20 | 0 | 1140 | 4.0 |
| | 10 | 931 | 4.1 |
| | 20 | 832 | 4.2 |
| | 30 | 762 | 4.4 |
| | 80 | 350 | 6.2 |
| | 100 | 262 | 6.3 |
| | 120 | 240 | 6.4 |
| 50 | 0 | 708 | 4.9 |
| | 10 | 578 | 5.0 |
| | 20 | 516 | 5.1 |
| | 30 | 473 | 5.2 |
| | 40 | 421 | 5.4 |
| | 70 | 300 | 7.2 |
| | 80 | 249 | 7.4 |
| 60 | 0 | 671 | 6.1 |
| | 10 | 547 | 6.2 |
| | 20 | 489 | 6.3 |
| | 30 | 261 | 6.4 |
| | 40 | 251 | 6.5 |
| | 60 | 250 | 7.2 |
| | 80 | 189 | 7.5 |

It is understood that a range of Si and Cu contents satisfying both the RRR and the 0.2% proof stress is 10 to 120 ppm in the case where reduction ratio of cold working is 5% in Table 5.

As shown in Table 5, however, when 60 ppm of Si is added together with 40 ppm or 60 ppm of Cu, the value of the RRR is almost the same as the minimum value (i.e. 250) to be satisfied in accordance with the present invention. Therefore, it is more preferable that the sum of contents of Si and Cu is to be 10 ppm or more to below 100 ppm so that a substantially high RRR value can be obtained.

As described above, as a result of adding Mg or Si and Cu to aluminum used for stabilization, an aluminum stabilized superconductor having high mechanical strength as well as exhibiting good thermal and electrical stability could be obtained.

Figure 6A:
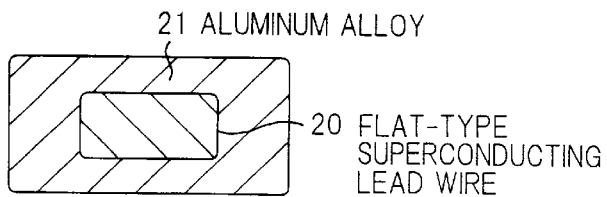
FIGS. 6A through 6E are sectional views each showing an aluminum stabilized superconductor according to the present invention.
Figure 6B:
Figure 6C:
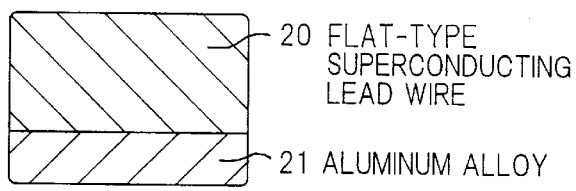
Figure 6D:
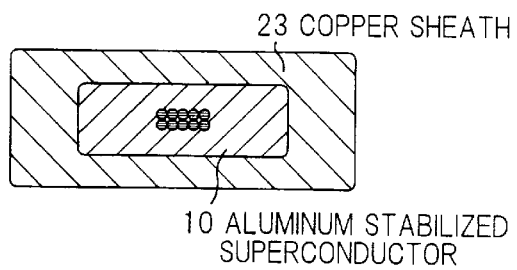
Figure 6E:
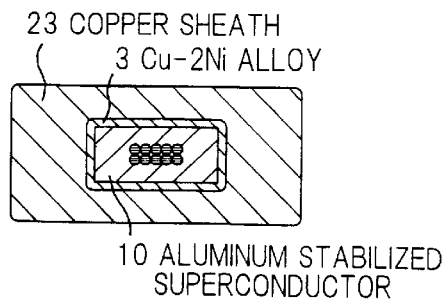

While the manner of practice according to the present invention has been described above, cross sections of the aluminum stabilized superconductor of the invention may be those as shown in FIGS. 6A through 6E wherein FIG. 6A shows a cross section of the straight angled superconducting lead wire 20 coated with the aluminum alloy 21, FIG. 6B shows across section of the superconducting single wire 22 coated with the aluminum alloy 21, FIG. 6C shows a cross section of a product prepared by joining the aluminum alloy 21 to the bottom of the flat type superconducting lead wire 20 by means of brazing or mechanical pressure welding, FIG. 6D shows a cross section of a product prepared by coating the aluminum stabilized superconductor 10 with a copper sheath 23 by the aid of soft solder, and FIG. 6E shows a cross section of a product prepared by interposing the Cu—2Ni alloy 3 between the aluminum stabilized superconductor 10 and the copper sheath 23 shown in FIG. 6D. In the above case, the aluminum alloy 21 corresponds to the above-mentioned Mg-added aluminum alloy 6 or Si-Cu-added aluminum alloy.

For the cold working after completing the above-mentioned extrusion of coating with aluminum, any suitable manner such as rolling, drawing, and swaging may be applied. In the present invention, $Nb_3Sn$, $(NbTi)_3Sn$, or $Nb_3Al$ base superconducting materials may be employed in place of Nb—Ti superconducting material.

As mentioned above, since Mg or Si and Cu have been added to aluminum used for stabilization according to the present invention, the resulting aluminum stabilized superconductor has high mechanical strength as well as good thermal and electrical stability while achieving light weight and downsizing thereof.

Figure 7:
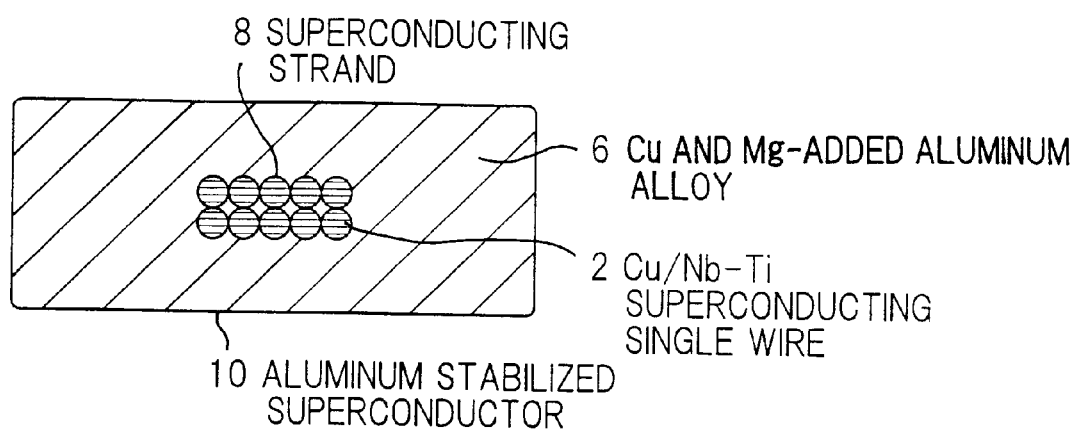
FIG. 7 is an aluminum stabilized superconductor according to another preferred embodiment of the present invention.

FIG. 7 shows an aluminum stabilized superconductor according to another preferred embodiment of the invention which is prepared in accordance with the following manner.

First, a tube made of oxygen free copper is filled with about 700 of copper matrix Nb—Ti superconducting lead wires to obtain a composite billet, the resulting billet is subjected to hydrostatic pressure extrusion, and further, ageing heat treatment and wire drawing process are repeated for the composite material three times to prepare a Cu/Nb—Ti superconducting single wire 2 having 0.74 mm diameter. Then, ten of the resulting Cu/Nb—Ti superconducting single wires 2 are stranded each other to produce a straight angled superconducting strand 8 having 1.33 mm thickness and 3.7 mm width.

The superconducting strand 8 is coated with a Cu and Mg-added aluminum alloy 6 by means of hot extrusion, the strand 8 thus extruded is reduced by 0 to 30% in accordance with cold working to produce an aluminum stabilized superconductor 10 having 10 mm thickness and 20 mm width according to the present invention. In the present example, the Cu and Mg-added aluminum alloy 6 is obtained by adding 10 to 160 ppm of Cu and Mg to aluminum having 99.999% purity.

In the following, the optimum condition with respect to a relationship between a reduction ratio of cold working after coating a superconductor with aluminum and a concentration of Cu and Mg to be added to pure aluminum will be described.

As described in FIGS. 4A and 4B, an interfacial shearing stress ($kg/mm^2$) defined between the superconducting strand 8 in each reduction ratio of cold working and the Cu and Mg-added aluminum alloy 6 is measured.

The following Table 6 shows measured results of interfacial shearing stress ($kg/mm^2$) defined between superconducting strand and aluminum used for stabilization by the use of the device shown in FIGS. 4A and 4B with respect to each reduction rat ion of cold working of an aluminum stabilized superconductor which is prepared by coating a superconducting strand with pure aluminum having 99.999% purity to which 40 ppm of Cu and Mg are added, respectively. In this measurement, a reduction ratio of cold working varies over a range of 0, 5, 10, 15, 20, 25, 30, 35, 40, and 45%. The measurement is carried out at room temperature, and interfacial shearing stress corresponds to a value obtained by dividing tensile force by an area of the interface.

TABLE 6

| Reduction ratio of Cold Working (%) | Interfacial Shearing Stress ($kg/mm^2$) |
| --- | --- |
| 0 | 2.5 |
| 5 | 2.4 |
| 10 | 2.4 |
| 15 | 2.1 |
| 20 | 2.1 |
| 25 | 1.6 |
| 30 | 1.5 |
| 35 | 1.2 |
| 40 | 0.5 |
| 45 | 0.3 |

From the results shown in Table 6, it is understood that although interfacial shearing stress does not scarcely deteriorate in the case where a reduction ratio of cold working is equal to or less than 20%, it deteriorates rapidly when exceeded 20%. Such interfacial shearing stress (adhesion of interface) has a connection with thermal stability. In the case when interfacial shearing stress is low, it means that joining the superconducting strand 8 to the Cu and Mg-added aluminum alloy 6 is insufficient so that heat produced in accordance mechanical disturbance cannot be conducted instantly to the Cu and Mg-added aluminum alloy 6, and thus, a period of time during which the heat is kept inside the superconducting strand 8 is prolonged. As a result, there is a case where the superconducting strand 8 cannot be returned to superconducting state, but it reaches to quenching state. Under certain circumstances, there is further a case where no heat is conducted to the Cu and Mg-added aluminum alloy 6.

In these circumstances, effective heat flux ($W/cm^2$) which is heat quantity (W) transferring per unit area (1 $cm^2$) was measured with respect to a sample belonging to the same lot as the sample for which the above described interfacial shearing stress was measured. In this measurement, the same result was obtained under the same condition as that of FIG. 5.

The following Table 7 indicates a relationship between reduction ratio of cold working and effective heat flux. From also the results of effective heat flux indicating thermal stability of the aluminum stabilized superconductor 10 shown in Table 7, it is understood that deterioration of thermal stability becomes remarkable, when a reduction ratio of cold working exceeds 20%.

TABLE 7

| Reduction ratio of Cold Working (%) | Effective Heat Flux (W/cm$^2$) |
|---|---|
| 0 | 0.298 |
| 5 | 0.292 |
| 10 | 0.293 |
| 15 | 0.286 |
| 20 | 0.287 |
| 25 | 0.222 |
| 30 | 0.220 |
| 35 | 0.203 |
| 40 | 0.190 |
| 45 | 0.152 |

Accordingly, as is understood from the results shown in Tables 6 and 7, 20% or less of cold working is desirable for the superconductor 8 after being coated with the Cu and Mg-added aluminum alloy 6 in accordance with hot extrusion in view of both mechanical strength and thermal stability.

On the other hand, a high residual resistance ratio RRR of the Cu and Mg-added aluminum alloy 6 is desirable. For sufficient thermal and electrical stability, it is required that RRR is 250 or more wherein RRR is a ratio of a resistance value $\rho$ (RT) at room temperature to a resistance value $\rho$ (4.2K) at very low temperature 4.2K, and it is represented by an equation RRR=$\rho$ (RT)/$\rho$ (4.2K). Moreover, when the aluminum stabilized superconductor 10 is used as a conductor for large-sized magnet, 4 kg/mm$^2$ or higher value is required in 0.2% proof stress to avoid any deformation due to electromagnet force. In the following Table 8, values of RRR and 0.2% proof stress in accordance with a relationship between Cu and Mg contents of Cu and Mg-added aluminum alloy and a reduction ratio of cold working of a superconductor are shown. In this case, the reduction ratio of cold working is 5%.

TABLE 8

| Amount of Cu Added (ppm) | Amount of Mg Added (ppm) | RRR | 0.2% Proof Stress (kg/mm$^2$) R.T |
|---|---|---|---|
| 0 | 0 | 3023 | 2.9 |
| 10 | 0 | 2014 | 3.2 |
| | 10 | 1651 | 4.05 |
| | 20 | 1475 | 4.1 |
| | 50 | 869 | 5.0 |
| | 90 | 375 | 6.0 |
| | 120 | 240 | 6.5 |
| 50 | 0 | 1140 | 3.8 |
| | 10 | 931 | 4.1 |
| | 20 | 832 | 4.2 |
| | 30 | 762 | 4.4 |
| | 50 | 350 | 6.2 |
| | 70 | 240 | 6.3 |
| | 90 | 230 | 6.4 |
| 90 | 0 | 500 | 3.8 |
| | 10 | 400 | 4.5 |
| | 20 | 240 | 4.7 |
| | 30 | 220 | 5.2 |
| | 40 | 200 | 5.4 |
| 120 | 0 | 240 | 3.9 |
| | 10 | 220 | 4.7 |
| | 20 | 200 | 5.0 |

TABLE 8-continued

| Amount of Cu Added (ppm) | Amount of Mg Added (ppm) | RRR | 0.2% Proof Stress (kg/mm$^2$) R.T |
|---|---|---|---|
| | 30 | 188 | 5.5 |
| | 40 | 162 | 6.5 |

In the Table 8, when contents of Cu and Mg increase, 0.2% proof stress elevates, and on the contrary, RRR decreases. It is understood that a range of Cu and Mg contents satisfying both the RRR and the 0.2% proof stress is 20 to 100 ppm. It is noted, however, that if the amount of Mg added is less than 10 ppm, the desired 0.2% proof stress can not be obtained.

As described above, as a result of adding Cu and Mg to aluminum used for stabilization, an aluminum stabilized superconductor having high mechanical strength as well as exhibiting good thermal and electrical stability could be obtained.

While the manner of practice according to the present invention has been described above, cross sections of the aluminum stabilized superconductor of the invention may be those as shown in FIGS. 6A through 6E wherein FIG. 6A shows a cross section of the flat-type superconducting lead wire 20 coated with the aluminum alloy 21, FIG. 6B shows a cross section of the superconducting single wire 22 coated with the aluminum alloy 21, FIG. 6C shows a cross section of a product prepared by joining the aluminum alloy 21 to the bottom of the flat-type superconducting lead wire 20 by means of brazing or mechanical pressure welding, FIG. 6D shows a cross section of a product prepared by coating the aluminum stabilized superconductor 10 with a copper sheath 23 by the aid of soft solder, and FIG. 6E shows a cross section of a product prepared by interposing the Cu—2Ni alloy 3 between the aluminum stabilized superconductor 10 and the copper sheath 23 shown in FIG. 6D. In the above case, the aluminum alloy 21 corresponds to the above-mentioned Cu and Mg-added aluminum alloy.

For the cold working after completing the above-mentioned extrusion of coating with aluminum, any suitable manner such as rolling, drawing, and swaging may be applied. In the present invention, Nb$_3$Sn, (NbTi)$_3$Sn, or Nb$_3$Al base superconducting materials may be employed in place of Nb—Ti superconducting material.

As mentioned above, since Cu and Mg have been added to aluminum used for stabilization according to the present invention, the resulting aluminum stabilized superconductor has high mechanical strength as well as good thermal and electrical stability while achieving light weight and downsizing thereof.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. An aluminum stabilized superconductor comprising:
   a superconducting wire prepared by embedding superconducting filaments in copper or a copper alloy matrix; and an aluminum stabilizing material covering an outer surface of said superconducting wire;

wherein said aluminum stabilizing material is an aluminum alloy with a purity of 99.999% or more comprising greater than 50 ppm and less than approximately 120 ppm of the sum of contents of Si and Cu and subjected to cold working reduction by approximately 5 to 20% and wherein a content of Si is between 10 ppm and 50 ppm and thereby the cold worked aluminum stabilizing material has 0.2% proof stress of at least 4 kgf/mm$^2$ at room temperature and a residual resistance ratio of at least 250.

2. An aluminum stabilized superconductor comprising:

a superconducting wire prepared by embedding superconducting filaments in copper or a copper alloy matrix, and an aluminum stabilizing material covering an outer surface of said superconducting wire;

wherein said aluminum stabilizing material is an aluminum alloy with a purity of 99.999% or more comprising 20 to 100 ppm of the sum of contents of Mg and Cu and subjected to cold working reduction by approximately 5 to 20%, and wherein a content of said Cu is between 10 ppm and 90 ppm and a content of said Mg is between 10 ppm and 90 ppm in said aluminum alloy, respectively and thereby the cold worked aluminum stabilizing material has 0.2% proof stress of at least 4 kgf/mm$^2$ at room temperature and a residual resistance ratio of at least 250.

* * * * *